United States Patent
Hung et al.

(10) Patent No.: US 6,174,451 B1
(45) Date of Patent: Jan. 16, 2001

(54) OXIDE ETCH PROCESS USING HEXAFLUOROBUTADIENE AND RELATED UNSATURATED HYDROFLUOROCARBONS

(75) Inventors: Raymond Hung, San Jose; Joseph P. Caulfield, Sunnyvale; Hongching Shan, San Jose; Ruiping Wang, Fremont; Gerald Z. Yin, Cupertino, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/193,056

(22) Filed: Nov. 16, 1998

Related U.S. Application Data

(63) Continuation-in-part of application No. 09/049,862, filed on Mar. 27, 1998.

(51) Int. Cl.[7] .................................................. H01L 21/31
(52) U.S. Cl. .............................. 216/67; 216/68; 216/72; 438/723; 438/738; 438/743
(58) Field of Search .................................... 438/714, 723, 438/724, 727, 738, 743, 744; 216/67, 68, 72, 80; 252/79.1

(56) References Cited

U.S. PATENT DOCUMENTS

| | | | |
|---|---|---|---|
| 5,176,790 | 1/1993 | Arleo et al. | 156/643 |
| 5,338,399 | 8/1994 | Yanagida | 156/662 |
| 5,366,590 | 11/1994 | Kadomura | 156/662 |
| 5,423,945 | 6/1995 | Marks et al. | 156/662.1 |
| 5,707,486 * | 1/1998 | Collins | 156/643.1 |
| 5,783,496 | 7/1998 | Flanner et al. | 438/743 |
| 5,795,825 * | 8/1998 | Sugano et al. | 438/690 |

FOREIGN PATENT DOCUMENTS

| | | | |
|---|---|---|---|
| 0644 584 A1 | 9/1994 | (EP) . | |
| 840365-A2 | 5/1998 | (EP) | H01L/21/311 |
| 57108267 | 6/1982 | (JP) . | |
| 57155732 | 9/1982 | (JP) . | |
| 04346427 * | 2/1992 | (JP) | H01L/21/302 |
| 9-191002 | 7/1997 | (JP) | H01L/21/3065 |
| 11186229 | 9/1999 | (JP) . | |
| WO 99/16110 | 4/1999 | (WO) . | |
| WO 99/34419 | 8/1999 | (WO) . | |

* cited by examiner

*Primary Examiner*—Randy Gulakowski
*Assistant Examiner*—Allan Olsen
(74) *Attorney, Agent, or Firm*—Charles Guenzer; Joseph Bach

(57) ABSTRACT

An oxide etching process, particular useful for selectively etching oxide over a feature having a non-oxide composition, such as silicon nitride and especially when that feature has a corner that is prone to faceting during the oxide etch. The invention uses one of three unsaturated 3- and 4-carbon fluorocarbons, specifically hexafluorobutadiene ($C_4F_6$), pentafluoropropylene ($C_3HF_5$), and trifluoropropyne ($C_3HF_3$), all of which have boiling points below 10° C. and are commercially available. The unsaturated hydrofluorocarbon together with argon is excited into a high-density plasma in a reactor which inductively couples plasma source power into the chamber and RF biases the pedestal electrode supporting the wafer. Preferably, a two-step etch is used process is used in which the above etching gas is used in the main step to provide a good vertical profile and a more strongly polymerizing fluorocarbon such as difluoromethane ($CH_2F_2$) is added in the over etch to protect the nitride corner.

52 Claims, 2 Drawing Sheets

OXIDE ETCH PROCESS USING HEXAFLUOROBUTADIENE AND RELATED UNSATURATED HYDROFLUOROCARBONS

RELATED APPLICATION

This application is a continuation in part of Ser. No. 09/049,862, filed Mar. 27, 1998.

FIELD OF THE INVENTION

The invention relates generally to etching of silicon integrated circuits. In particular, the invention relates to etching silicon oxide and related materials in a process that is capable of greatly reduced etching rates for silicon nitride and other non-oxide materials but still producing a vertical profile in the oxide.

BACKGROUND ART

In the fabrication of silicon integrated circuits, the continuing increase in the number of devices on a chip and the accompanying decrease in the minimum feature sizes have placed increasingly difficult demands upon many of the many fabrication steps used in their fabrication including depositing layers of different materials onto sometimes difficult topologies and etching further features within those layers.

Oxide etching has presented some of the most difficult challenges. Oxide is a somewhat generic term used for silica, particularly silicon dioxide ($SiO_2$) although slightly non-stoichiometric compositions $SiO_x$ are also included, as is well known. The term oxide also covers closely related materials, such as oxide glasses including borophosphosilicate glass (BPSG). Some forms of silicon oxynitride are considered to more closely resemble a nitride than an oxide. Small fractions of dopants such as fluorine or carbon may be added to the silica to reduce its dielectric constant. Oxide materials are principally used for electrically insulating layers, often between different levels of the integrated circuit. Because of the limits set by dielectric breakdown, the thickness of the oxide layers cannot be reduced to much below 0.5 to 1 $\mu$m. However, the minimum feature sizes of contact and via holes penetrating the oxide layer are being pushed to well below 0.5 $\mu$m. The result is that the holes etched in the oxide must be highly anisotropic and must have high aspect ratios, defined as the depth to the minimum width of a hole. A further problem arises from the fact that the underlying silicon may be formed with active doped regions of thicknesses substantially less than the depth of the etched hole (the oxide thickness). Due to manufacturing variables, it has become impossible to precisely time a non-selective oxide etch to completely etch through the silicon oxide without a substantial probability of also etching through the underlying active silicon region.

The anisotropy can be achieved in dry plasma etching in which an etching gas, usually a fluorocarbon, is electrically excited into a plasma. The plasma conditions may be adjusted to produce highly anisotropic etching in many materials. However, the anisotropy should not be achieved by operating the plasma reactor in a pure sputtering mode in which the plasma ejects particles toward the wafer with sufficiently high energy that they sputter the oxide. Sputtering is generally non-selective, and high-energy sputtering also seriously degrades semiconducting silicon exposed at the bottom of the etched contact hole.

In view of these and other problems, selective etching processes have been developed which depend more upon chemical effects. These processes are often described as reactive ion etching (RIE). A sufficiently high degree of selectivity allows new structures to be fabricated without the need for precise lithography for each level.

An example of such an advanced structure is a self-aligned contact (SAC), illustrated in the cross-sectional view of FIG. 1. A SAC structure for two transistors is formed on a silicon substrate 2. A polysilicon gate layer 4, a tungsten silicide barrier and glue layer 6, and a silicon nitride cap layer 8 are deposited and photolithographically formed into two closely spaced gate structures 10 having a gap 12 therebetween. Chemical vapor deposition is then used to deposit onto the wafer a substantially conformal layer 14 of silicon nitride ($Si_3N_4$), which coats the top and sides of the gate structures 10 as well as the bottom 15 of the gap 12. In practice, the nitride deviates from the indicated stoichiometry and may have a composition of $SiN_x$, where x is between 1 and 1.5. The nitride acts as an electrical insulator. Dopant ions are ion implanted using the gate structures 10 as a mask to form a self-aligned p-type or n-type well 16, which acts as a common source for the two transistors having respective gates 10. The drain structures of the transistors are not illustrated.

An oxide field layer 18 is deposited over this previously defined structure, and a photoresist layer 20 is deposited over the oxide layer 18 and photographically defined into a mask so that a subsequent oxide etching step etches a contact hole 22 through the oxide layer 18 and stops on the portion 24 of the nitride layer 14 underlying the hole 22. It is called a contact hole because the metal subsequently deposited into the contact hole 22 contacts silicon rather than a metal layer. A post-etch sputter removes the nitride portion 24 at the bottom 15 of the gap 12. The silicon nitride acts as an electrical insulator for the metal, usually aluminum, thereafter filled into the contact hole 22.

Because the nitride acts as an insulator, the SAC structure and process offer the advantage that the contact hole 22 may be wider than the width of the gap 12 between the gate structures 10. Additionally, the photolithographic registry of the contact hole 22 with the gate structures 10 need not be precise. However, to achieve these beneficial effects, the SAC oxide etch must be highly selective to nitride. That is, the process must produce an oxide etch rate that is much greater than the nitride etch rate. Numerical values of selectivity are calculated as the ratio of the oxide to nitride etch rates. Selectivity is especially critical at the corners 26 of the nitride layer 14 above and next to the gap 12 since the corners 26 are the portion of the nitride exposed the longest to the oxide etch. Furthermore, they have a geometry favorable to fast etching that tends to create facets at the corners 26.

Furthermore, increased selectivity is being required with the increased usage of chemical mechanical polishing (CMP) for planarization of an oxide layer over a curly wafer. The planarization produces a flat oxide surface over a wavy underlayer substrate, thereby producing an oxide layer of significantly varying thickness. As a result, the time of the oxide etch must be set significantly higher, say by 100%, than the etch of the design thickness to assure penetration of the oxide. This is called over etch, which also accounts for other process variations. However, for the regions with a thinner oxide, the nitride is exposed that much longer to the etching environment.

Ultimately, the required degree of selectivity is reflected in the probability of an electrical short between the gate structures 10 and the metal filled into the contact hole 22.

The etch must also be selective to photoresist, for example at facets 28 that develop at the mask corners, but the requirement of photoresist selectivity is not so stringent since the photoresist layer 20 may be made much thicker than the nitride layer 14.

In the future, the most demanding etching steps are projected to be performed with high-density plasma (HDP) etch reactors. Such HDP etch reactors achieve a high-density plasma having a minimum average ion density of $10^{11}$ cm$^{-3}$ across the plasma exclusive of the plasma sheath. Although several techniques are available for achieving a high-density plasma such as electron cyclotron resonance and remote plasma sources, the commercially most important technique involves inductively coupling RF energy into the source region. The inductive coil may be cylindrically wrapped around the sides of chamber or be a flat coil above the top of the chamber or represent some intermediate geometry.

An example of an inductively coupled plasma etch reactor is the IPS etch reactor, which is also available from Applied Materials and which by Collins et al. describe in U.S. patent application, Ser. No. 08/733,544, filed Oct. 21, 1996 and in European Patent Publication EP-840,365-A2. As shown in FIG. 2, a wafer 30 to be processed is supported on a cathode pedestal 32 supplied with RF power from a first RF power supply 34. A silicon ring 36 surrounds the pedestal 32 and is controllably heated by an array of heater lamps 38. A grounded silicon wall 40 surrounds the plasma processing area. A silicon roof 42 overlies the plasma processing area, and lamps 44 and water cooling channels 46 control its temperature. The temperature-controlled silicon ring 36 and silicon roof 42 may be used to scavenge fluorine from the fluorocarbon plasma. For some applications, fluorine scavenging can be accomplished by a solid carbon body, such as amorphous or graphitic carbon, or by other non-oxide silicon-based or carbon-based materials, such as silicon carbide.

Processing gas is supplied from one or more bottom gas feeds 48 through a bank of mass flow controllers 50 under the control of a system controller 52, in which is stored the process recipe in magnetic or semiconductor memory. Gas is supplied from respective gas sources 54, 56, 58. The conventional oxide etch recipe uses a combination of a fluorocarbon or hydrofluorocarbon and argon. Octafluorocyclobutane ($C_4F_8$) and trifluoromethane ($CHF_3$) are popular fluorocarbons, but other fluorocarbons, hydrofluorocarbons, and combinations thereof are used.

An unillustrated vacuum pumping system connected to a pumping channel 60 around the lower portion of the chamber maintains the chamber at a preselected pressure.

In the used configuration, the silicon roof 42 is grounded, but its semiconductor resistivity and thickness are chosen to pass generally axial RF magnetic fields produced by an inner inductive coil stack 62 and an outer inductive coil stack 64 powered by respective RF power supplies 66, 68.

Optical emission spectroscopy (OES) is a conventional monitoring process used for end-point detection in plasma etching. An optical fiber 70 is placed in a hole 72 penetrating the chamber wall 40 to laterally view the plasma area 74 above the wafer 30. An optical detector system 76 is connected to the other end of the fiber 70 and includes one or more optical filters and processing circuitry that are tuned to the plasma emission spectrum associated with the aluminum or copper species in the plasma. Either the raw detected signals or a trigger signal is electronically supplied to the controller 52, which can use the signals to determine that one step of the etch process has been completed as either a new signal appears or an old one decreases. With this determination, the controller 52 can adjust the process recipe or end the etching step.

The IPS chamber can be operated to produce a high-density or a low-density plasma. The temperature of the silicon surfaces and of the wafer can be controlled. The bias power applied to the cathode 42 can be adjusted independently of the source power applied to the coils 62, 64.

It has become recognized, particularly in the use of HDP etch reactors, that selectivity in an oxide etch can be achieved by a fluorocarbon etching gas forming a polymer layer upon the non-oxide portions, thereby protecting them from etching, while the oxide portions remain exposed to the etching environment. It is believed that the temperature controlled silicon ring 36 and roof 42 in the reactor of FIG. 2 control the fluorine content of the polymer, and hence its effectiveness against etching by the fluorocarbon plasma, when the polymer overlies a non-oxide. However, this mechanism seems to be responsible for at least two problems if high selectivity is being sought. If excessive amounts of polymer are deposited on the oxide or nitride surfaces in the contact hole being etched, the hole can close up and the etching is stopped prior to complete etching of the hole. This deleterious condition is referred to as etch stop.

Further, the chemistry may be such that the polymer formation depends critically upon the processing conditions. It may be possible to achieve high selectivity with one set of processing conditions, but very small variations in those parameters may be enough to substantially reduce the selectivity on one hand or to produce etch stop on the other. Such variations can occur in at least two ways. The conditions at the middle of the wafer may vary from those at the center. Furthermore, the conditions may change over time on the order of minutes as the chamber warms up or on the order of days as the equipment ages or as chamber parts are replaced. It is felt that hardware can be controlled to no better than ±5 or 6%, and a safety margin or 3 to 6 is desired. Mass flow controllers 46 are difficult to control to less than ±1 sccm (standard cubic centimeter per minute) of gas flow so gas flows of any constituent gas of only a few sccm are prone to large percentage variations.

These factors indicate that a commercially viable etch process must have a wide process window. That is, moderate variations in such parameters as gas composition and chamber pressure should produce only minimal changes in the resultant etching.

Several oxide etch processes have been proposed which rely upon higher-order hydrogen-free fluorocarbons and hydrofluorocarbons, both generically referred to as fluorocarbons. Examples of higher-order fluorocarbons are fluoroethane, fluoropropane, and even fluorobutane, both in its linear and cyclic forms. In U.S. Pat. No. 5,423,945, Marks et al. disclose an oxide etch selective to nitride using $C_2F_6$ in an HDP etch reactor having a thermally controlled silicon surface. Later process work with the IPS chamber of FIG. 2 has emphasized $C_4F_8$ as the principal etchant species. Wang et al. have disclosed the use of fluoropropanes and fluoropropylenes, e.g., $C_3F_6$ and $C_3H_2F_6$, in U.S. patent applications, Ser. Nos. 08/964,504 and 09/049,862, filed Nov. 5, 1997 and Mar. 27, 1998 respectively. The two examples of fluorocarbons have F/C ratios of 2, as does $C_4F_8$, and some researchers, including Yanagida in U.S. Pat. No. 5,338,399, believe this value produces the best passivating polymer. We have observed, however, that the etching profile cannot be controlled with $C_3H_2F_6$.

If possible, it is desirable to use the already widely available fluoromethanes, which include carbon tetrafluoride ($CF_4$), trifluoromethane ($CHF_3$), difluoromethane ($CH_2F_2$), and monofluoromethane ($CH_3F$). Hung et al. in U.S. patent application, Ser. No. 08/956,641, filed Oct. 23, 1997, suggest the use of $CHF_3$ and $CH_2F_2$. We have observed that this last combination is insufficiently selective, indicating poor polymer formation.

Although octafluorocyclobutane ($C_4F_8$) remains the most popular oxide etching gas, we observe that it suffers from too narrow a process window. Furthermore, although $C_4F_8$ is known to provide selectivity at the bottom of the etching hole, it provides little sidewall passivation, which is required for the desired vertical profiles. Also, $C_4F_8$ has a boiling point of +1° C., which is considered somewhat high, especially in view of a trend to operate with very cold cathodes. Often carbon monoxide (CO) is added to $C_4F_8$ to increase the sidewall passivation as well as increase general nitride selectivity. However, CO is not only toxic, it also forms carbonyls with nickel and iron in gas cylinders and supply lines. The carbonyls are believed to contaminate wafers. For these reasons, the use of CO is not preferred.

The two approaches using alternatively the fluoromethanes and hexafluoropropane ($C_3H_2F_6$) both provide wider process windows with satisfactory etching characteristics, but we still believe that the process windows are too narrow and the etching characteristics can be further improved.

Hexafluoropropylene ($C_3F_6$) has also been investigated by Wang et al. in the previously cited patents. It has the F/C ratio desired by Yanagida. However, the results show insufficient selectivity.

A theoretically promising etching gas is tetrafluoroethylene ($C_2F_4$). However, it is considered dangerously explosive.

There are further considerations in selecting fluorocarbons for oxide etching. If a higher-order fluorocarbon is selected, a presently available commercial supply is greatly desired, even if a semiconductor grade needs to be developed. Furthermore, many of the higher-order fluorocarbons are liquids at near to room temperature. It is still possible to use liquid precursors by the use of bubblers to atomize the liquid in a carrier gas. However, bubblers present another expense, they need frequent maintenance, and the effective flow rate of the liquid precursor is difficult to tightly control. Gaseous precursors are much more preferred.

For these reasons, other fluorocarbon etching gases are desired.

SUMMARY OF THE INVENTION

The invention may be summarized as an oxide etching process using unsaturated higher-order fluorocarbons with a low but finite hydrogen content. The primary examples are hexafluorobutadiene ($C_4HF_6$), pentafluoropropylene ($C_3HF_5$), and trifluoropropyne ($C_3HF_3$), most preferably hexafluorobutadiene. When nitride facet selectivity is required, a more heavily polymerizing gas should be added, such as hydrofluoromethane, preferably difluoromethane ($CH_2F_2$). A neutral working gas such as argon (Ar) is preferably used in a high-density plasma reactor. A wide process window is achieved when the pressure is kept below 20 milliTorr and the bias power nearly equals the source power. The etching is preferably divided into two substeps. The first substep includes little or no heavily polymerizing gas and is tuned for vertical profile in the oxide. The second substep includes the heavily polymerizing gas and is tuned for nitride selectivity and no etch stop.

DETAILED DESCRIPTION OF THE PREFERRED EMBODIMENTS

We believe that higher-order fluorocarbons, specifically those having three carbons or more, and those having a F/C ratio of one or preferably greater but less than two will produce a polymer providing satisfactory etching characteristics with a wide process window. The fluorocarbons of more than four carbons are unnecessarily complex, especially since they tend to break up in a high-density plasma. A high-density plasma tends to dissociate gas molecules into radicals. A longer carbon chain provides a larger variety of activated particles, including the $CF_2^*$ radical usually believed to be responsible for the formation of the fluorocarbon polymer chain. The longer carbon precursor atoms provide a larger variety of particles, which may be helpful in cross linking the polymer and the distribution of which may be controlled by different power levels in the HDP reactor. It is known that a low-fluorine polymer provides better selectivity probably because of increased cross linking resulting in a tougher, more protective polymer. Although an F/C ratio of two corresponds to a single segment of a fluorocarbon chain, it does not account for polymeric cross linking. Silicon-based fluorine scavenging is an attempt at reducing the fluorine content by scavenging any free radicals in the plasma. The longer carbon molecules with F/C ratios of less than two provide another mechanism for reducing the fluorine content of the polymer.

The fluoropropane gases $C_3HF_7$ and $C_3H_2F_6$ chosen by Wang et al. in the above cited patents were intended to satisfy at least some of these requirements. However, as mentioned above, at least $C_3H_2F_6$ produces poor profiles. However, there is no reason to restrict the 3-carbon fluorocarbon to fluoropropanes. Unsaturated 3-carbon fluorocarbons can also be used. Three commercially available unsaturated fluorocarbon and hydrodrofluorocarbon gases satisfy these requirements. An unsaturated fluorocarbon is one having a double or a triple bond between neighboring carbons.

Figure 3:
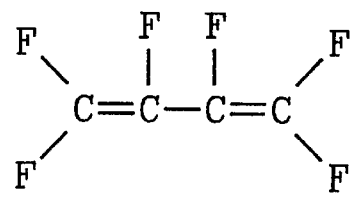
FIGS. 3 through 5 illustrate chemical structures of three etching gases of the invention.

A first example of such a gas is hexafluorobutadiene ($C_4F_6$). The isomer hexafluoro-1,3-butadiene has a chemical structure illustrated in FIG. 3 with four carbon atoms, six fluorine atoms, and two double bonds. Its F/C ratio is 1.5. It has a boiling point of 6–7° C.

Figure 4:
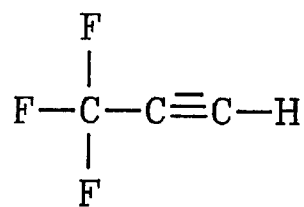

A second example is trifluoropropyne ($C_3HF_3$ and alternatively named trifluoromethylacetylene). The isomer 3,3,3-trifluoro-1-propyne has a chemical structure illustrated in FIG. 4 with three carbon atoms, three fluorine atoms, one hydrogen atom, and one triple bond. Its F/C ratio is 1. It has a boiling point of –48° C.

Figure 5:
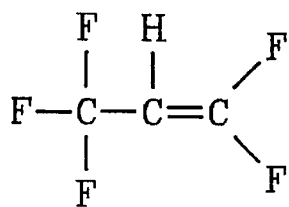

A third example is pentafluoropropylene ($C_3HF_5$ and alternatively named pentafluoropropene). The isomer 1,1,3,3,3-pentafluoropropylene has a chemical structure illustrated in FIG. 5 with three carbon atoms, five fluorine atoms, one hydrogen atom, and one double bond. Its F/C ratio is 1.67. It has a boiling point of –21° C. Wang et al. in the parent U.S. patent application Ser. No. 09/049,862 suggests $C_3HF_5$ as a substitute for $C_3F_6$.

Other isomers may be available with only slightly changed boiling points. No attempt has been made to characterize the stereoisomers. All the exemplary fluorocarbons form in linear chains.

Experimental data was obtained for the use of hexfluorobutadiene ($C_4F_6$) as the primary etching gas. This gas was chosen for the experiments because of its ready commercial availability. Fukuta has previously disclosed an oxide etching process using $C_4F_6$ in Laid-Open Japanese Published Application (Kokai) 9-191002. However, he uses a magnetically enhanced capacitively coupled etch chamber. His structure requires selectivity only at the bottom of a via hole, and he does not address the high selectivity required for via holes in advanced processes like SAC. The capacitively coupled reactor does not allow the decoupling of the source and bias power.

A first etch recipe is listed in TABLE 1.

TABLE 1

|  | First Etch Recipe | Second Etch Recipe |
| --- | --- | --- |
| $C_4F_6$ Flow (sccm) | 20 | 20 |
| $CH_2F_2$ Flow (sccm) | 0 | 15 |
| Ar Flow (sccm) | 100 | 100 |
| Inner Source Power (W) | 180 | 180 |
| Outer Source Power (W) | 1260 | 1260 |
| Bias Power (W) | 1400 | 1400 |
| Pressure (m Torr) | 4 | 4 |
| Roof Temp. (° C.) | 200 | 200 |
| Ring Temp. (° C.) | 270 | 270 |
| Cathode Temp. (° C.) | +10 | +10 |
| Backside He Pressure (T) | 7 | 7 |
| Time (s) | 120 | 120 |

Figure 2:
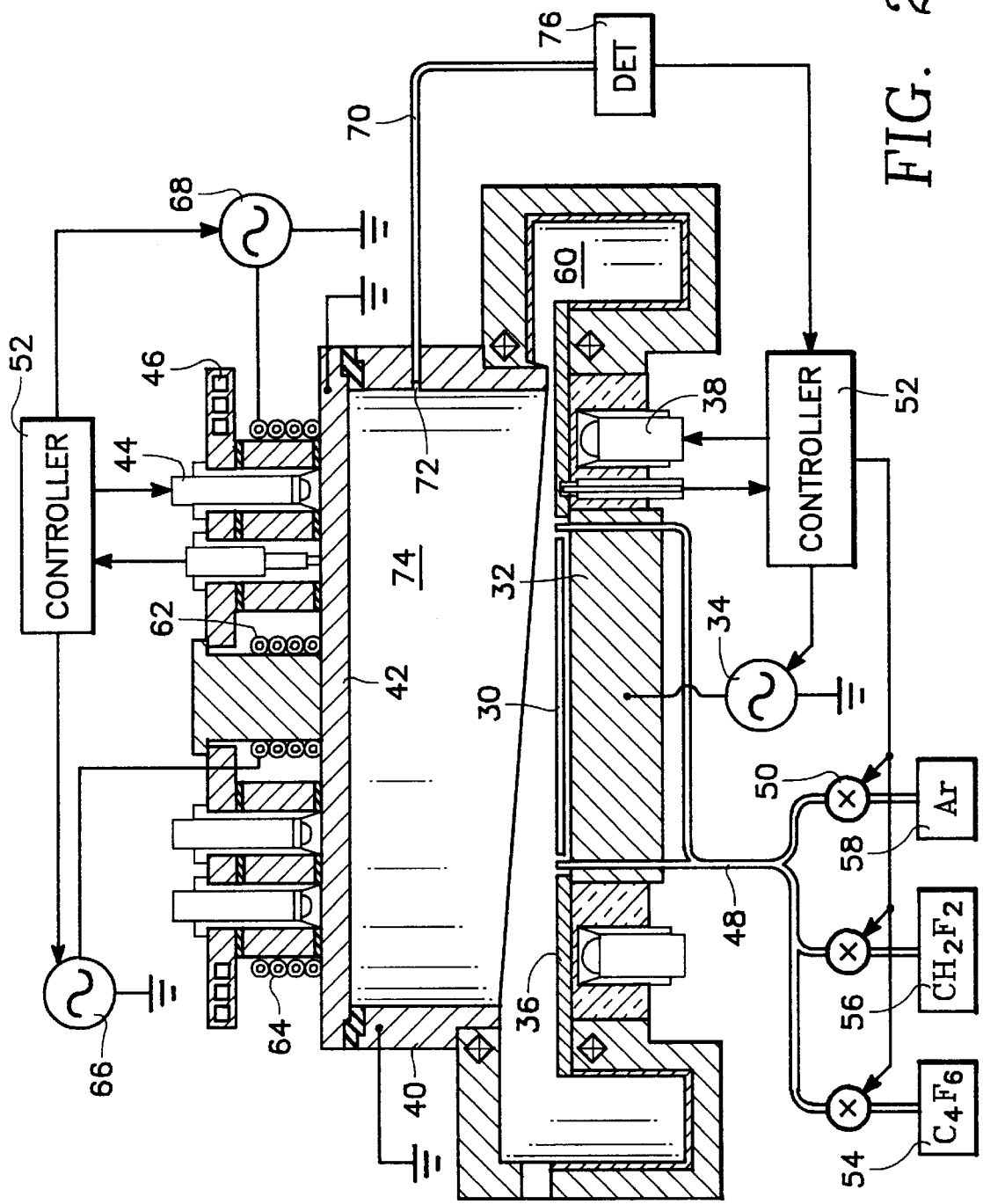
FIG. 2 is a schematic view, partly in cross section, of an inductively coupled high-plasma density etch reactor.

This recipe was tested in the IPS chamber illustrated in FIG. 2. The recipe is characterized as having a high argon content, a much higher outer coil power than inner coil power by at least a factor of 5 so as to concentrate the magnetic field at the outer periphery, a low pressure, and a relatively high silicon ring temperature. The bias power is relatively high compared to the source power of between 50% and 150%. However, the separate control of the bias power is considered important for obtaining high nitride selectivity with reasonable etching rates. The source power controls the ion and radical flux while the bias power controls the ion energy incident on the wafer. Too high an ion energy will resemble non-selective sputtering. The high-density plasma is further important because it produces a higher fraction of ionized etching particles, which can be directed to the bottom of holes with high aspect ratios.

Two SAC structures, as illustrated in FIG. 2, were used in the experimental work. A first, short SAC structure has a TEOS oxide thickness of about 0.55 μm on top of a nitride-covered having a height of about 0.3 μm. That is, the total oxide etch depth is 0.85 μm.

The first recipe produces an oxide etch rate of about 600 nm/min. The profile varies over the wafer with angular values of about 87°. However, the selectivity is about 20:1 at the corner, and severe faceting is observed at the nitride corner.

No etch stop is observed with this recipe or with any of the other reported recipes, and it will not be hereafter referenced.

A recipe similar to the first $C_4F_6$ recipe was compared to an optimized recipe using hexafluoropropane ($C_3H_2F_6$) that is somewhat similar to the $C_4F_6$ recipe. The recipes were tested on a second, tall SAC structure having 0.75 μm of TEOS oxide over a 0.45 μm-high gate structure for a total oxide etch depth of 1.2 μm and with a trench opening of about 0.35 μm. The results for $C_4F_6$ are about the same as described above. The $C_3H_2F_6$ etch produces a V-shaped profile with a sidewall angle of 83–85°. The same profile is observed in the nitride, indicating no effective selectivity. The same recipes were applied to a simulated structure having 1.2 μm of oxide over nitride but no gate structure. The $C_4F_6$ recipe shows some inward flaring below about 0.75 μm, but this should not present a problem if both sidewalls fall on respective gate structures and nitride selectivity is adequately high. The $C_3H_2F_6$ recipe produces the same V-shaped profile to the bottom of the 1.2 μm-thick oxide.

In order to increase the nitride selectivity for the $C_4F_6$ recipe and to decrease the nitride faceting, a more heavily polymerizing fluorocarbon gas may be added to the etching mixture. A fluoromethane is preferred. Difluorofluoromethane ($CH_2F_2$) is less polymerizing than monofluoromethane ($CH_3F$) so that standard mass flow controllers can adequately meter its flow. A second etch recipe listed in TABLE 1 was used having somewhat less $CH_2F_2$ than $C_4F_6$. The second recipe was used with the first, shallow SAC structure described above. The observed oxide etch rate is about 620 nm/min, and the nitride selectivity is significantly improved to about 30:1. However, the profile angle when the entire etch uses the second recipe is substantially degraded to about 84°.

To combine the best features of both etch recipes, a two-step oxide etch recipe has been developed. As illustrated in the process flow diagram of FIG. 6, a main etch 80 is first performed using an etching gas mixture of $C_4F_6$ and argon. The main etch provides a fast etch rate and good vertical profiles. Then, an over etch 82 is performed in which the polymerizing $CH_2F_2$ is added in order to increase the nitride selectivity and to thus protect the nitride corners. Vertical profile is not so important in the over etch, especially when the main etch has already reached the nitride.

A first embodiment of the two-step etch recipe is summarized in TABLE 2.

TABLE 2

|  | Main Etch | Over Etch |
| --- | --- | --- |
| $C_4F_6$ Flow (sccm) | 20 | 20 |
| $CH_2F_2$ Flow (sccm) | 0 | 10 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (m Torr) | 10 | 10 |
| Roof Temp. (° C.) | 230 | 230 |
| Ring Temp. (° C.) | 300 | 300 |
| Cathode Temp. (° C.) | +15 | +15 |
| Backside He Pressure (T) | 7 | 7 |
| Time (s) | 100 | 30 |

This recipe was applied to the second, tall SAC structure. The profile angle in the oxide portion of the hole is observed to be at least 87°, and the nitride selectivity is acceptable.

The timing of the switch between the main etch and the over etch is chosen such that the main etch reaches the nitride bottom at most of the locations on the wafers and the over etch guarantees a complete etch without producing excessive nitride faceting. To provide further nitride protection, the changeover can be moved to a point where the main etch has passed the top of the nitride at most locations, that is, is somewhere in the gap between the gate structures. The changeover can be controlled dynamically by relying on optical emission spectroscopy or equivalent means tuned to an emission of a nitride byproduct. Thereby, the polymerizing gas is added as soon as the main etch has reached the top nitride at a a significant number of locations.

A number of experiments were then performed to determine the process window and the fact that it is relatively wide. In a first pair of experiments, a one-step $C_4F_6/CH_2F_2$ etch was performed on the shallow SAC structure having a 0.35 µm trench aperture following alternatively the two variation recipes listed in TABLE 3.

TABLE 3

|  | First Var. | Second Var. |
| --- | --- | --- |
| $C_4F_6$ Flow (sccm) | 17 | 25 |
| $CH_2F_2$ Flow (sccm) | 5 | 5 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (m Torr) | 4.5 | 4.5 |
| Roof Temp. (° C.) | 230 | 230 |
| Ring Temp. (° C.) | 300 | 300 |
| Cathode Temp. (° C.) | +10 | +10 |
| Backside He Pressure (T) | 7 | 7 |
| Time (s) | 150 | 150 |

These two recipes vary the flow of $C_4F_6$ by 15% about its baseline value of 20 sccm. The other parameters are somewhat different from the baseline values of TABLE 2, but are close enough to establish a window for the $C_4F_6$ in the critical over etch. Nitride corner etching is barely observable. The minimum profile angle varied between 3° and 4° between the two recipes, which is better than the 84° of the second etch recipe of TABLE 1. Inward tapering occurs at the bottom of the etch. Similar results are observed with 0.4 µm trenches.

This ±15% window for $C_4F_6$ flow is to be compared with the window for an optimized $C_4F_8$ recipe of 15 sccm of $C_4F_6$ and 28 sccm of $CH_2F_2$ with other parameters similar to those for a $C_4F_6$ etch. A 20% reduction of the $C_4F_8$ flow to 12 sccm produces severe nitride faceting to the extent of punch through at some locations. A 20% increase to 18 sccm produces very good nitride corner selectivity but increases tapering to the extent that some oxide is not etched at the side of the gate structure.

The baseline recipe of TABLE 2 was varied to decrease the silicon ring temperature to 255° C. in both the main etch and the over etch. For both the shallow and tall SAC structures, the lower ring temperature increases the profile angle to at least 88° and eliminates sidewall oxide that tends to form on the walls of the nitride at the bottom of the trench. Nitride corner selectivity decreases somewhat, but it is still acceptable.

In two further experiments, the over etch recipe was modified to include 20 sccm of $C_4F_6$ and 5 sccm of $CH_2F_2$. A satisfactory etch is obtained at silicon temperatures of 300° C. for the ring and 230° C. for the roof. However, if the ring temperature is reduced to 245° C. and the roof temperature to 220° C. with the same flow of $CH_2F_2$, the nitride corner is severely faceted. Nonetheless, the silicon scavenging by the hot silicon parts can be traded off against the polymerization produced by the $CH_2F_2$. Third and fourth variant recipes for the over etch are listed in TABLE 4.

TABLE 4

|  | Third Var. | Fourth Var. |
| --- | --- | --- |
| $C_4F_6$ Flow (sccm) | 20 | 20 |
| $CH_2F_2$ Flow (sccm) | 15 | 5 |
| Ar Flow (sccm) | 100 | 100 |
| Inner Source Power (W) | 0 | 0 |
| Outer Source Power (W) | 1600 | 1600 |
| Bias Power (W) | 1400 | 1400 |
| Pressure (m Torr) | 4.5 | 4.5 |
| Roof Temp. (° C.) | 200 | 230 |
| Ring Temp. (° C.) | 245 | 300 |
| Cathode Temp. (° C.) | +10 | +10 |
| Backside He Pressure (T) | 7 | 7 |
| Time (s) | 150 | 150 |

Both variant recipes applied to a one-step etch of the shallow SAC structure show a satisfactory etch. Nitride corner etching is not readily observable, and the profile angle is at least 86°, which is acceptable for the over etch.

Two sets of experiments were performed to determine the sensitivity to pressure variations. In the first set, a main etch recipe with no $CH_2F_2$ was used to etch the entire oxide layer, both in a shallow and in a tall SAC structure. The pressure was alternatively set at 10, 15, and 20 milliTorr. The minimum profile angles decreases from 88° at 10 milliTorr, to 87° at 15 milliTorr, and to 86° at 20 milliTorr, all considered to be acceptable values. The previously described lower sidewall tapering is observed at all pressures. Without the polymerizing $CH_2F_2$, significant but not severe nitride corner faceting is observed, particularly at the lower pressure, and a 100s etch tends to punch through the bottom nitride layer. However, the over etch recipe is intended to circumvent the poor nitride selectivity of the main etch recipe. Thus, over the pressure range of 10 to 20 milliTorr, the main etch performs satisfactorily.

In a second set of experiments, an over etch recipe was used to etch a short SAC structure and the pressure was alternately set to 4.5 and 7 milliTorr. No nitride corner etching is readily observable at either pressure.

Similar results are expected with the other two unsaturated fluorocarbons, trifluoropropyne ($C_3HF_3$) and pentafluoropropylene ($C_3HF_5$).

Figure 1:
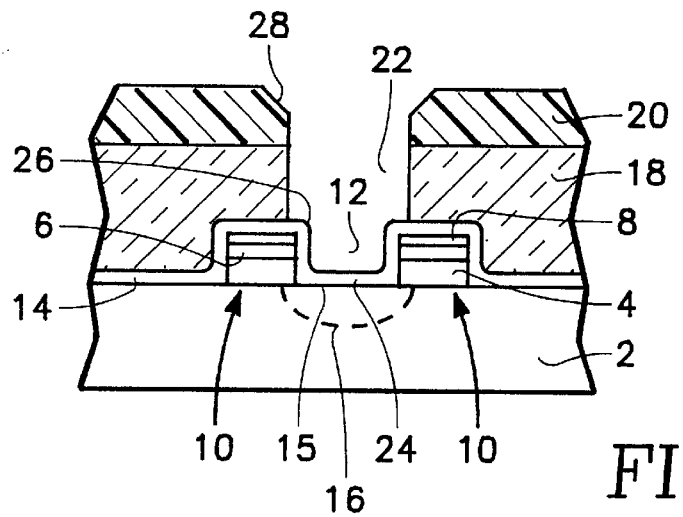
FIG. 1 is a cross-section view of a self-aligned contact (SAC) structure.
Figure 6:
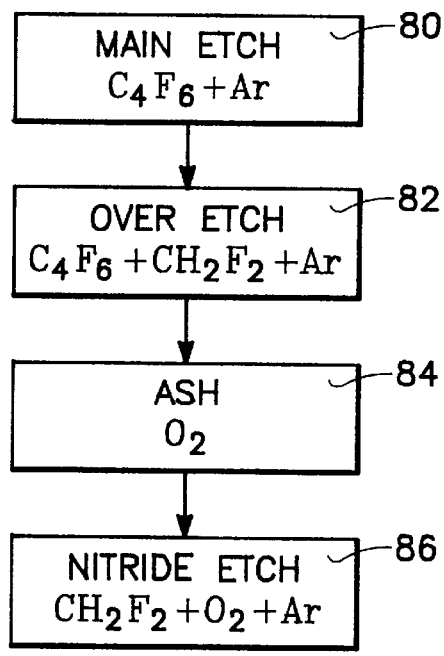
FIG. 6 is a flow diagram of one embodiment of the integrated etching process of the invention.

In the integrated etching process of FIG. 6, after the completion of the main etch 80 and the over etch 82, an ashing step 84 removes the remaining photoresist and deposited polymer, usually with an unbiased oxygen plasma. Then, a nitride etch step 86 removes the nitride portion 26 remaining at the bottom of the hole 22, as illustrated in FIG. 1. This step typically uses a fluorocarbon, such as $CH_2F_2$, in combination with argon and oxygen in a soft plasma etch. The oxygen destroys any nitride selectivity. Hung et al. describe these final steps in U.S. patent application Ser. No. 09/149,810, filed Sep. 8, 1998.

Although the main etching steps described above did not use any polymerizing fluoromethane, it is understood that nearly the same effect could be achieved by flowing in the main etch no more than 20% of the fluoromethane used in the over etch.

Although argon is the usual chemically inactive carrier gas, other gases can be substituted, such as the other rare gases, such as neon.

Although the description above concentrated on selectivity to nitride, the mechanisms involved in selective oxide etching depend principally as far as materials are concerned upon whether the layer contains a significant amount of oxygen or not. Therefore, the same chemistry is applicable to etching oxide over a non-oxide layer or feature.

The examples reported above were obtained on the inductively coupled IPS reactor capable of producing a high-density plasma. Other inductively coupled plasma etch reactors are available with a variety of coil configurations. The current inductively coupled HDP reactors have the advantage of decoupling the source power from the bias power, thus allowing a reasonable etching rate with low ion energies. There are other ways of decoupling the source and bias power, for example, with a remote plasma source (RPS) or with an electron-cyclotron resonance (ECR) reactor.

Although the above results were derived from experiments performed on SAC structures, there are other structures in which high nitride corner selectivity is required. A pair of examples include structures in which a nitride layer is used as a mask. A first example is a silicon nitride hard mask placed between the photoresist and the oxide layer. A first etching step etches the photoresist pattern into the hard mask. Thereafter, a second etching step etches the oxide layer according to the pattern of the hard mask. In the second step, photoresist selectivity is not required, but the nitride corner of the hard mask is exposed throughout most of the second step so that high nitride corner selectivity is required. A second example is a self-aligned local interconnect (SALI), as Wang et al. describe in U.S. patent application Ser. No. 08/964,504, filed Nov. 5, 1998. In the SALI structure the nitride covered gate structure may be completely exposed, and further a planar bottom nitride is exposed for a long period. A third example is a dual-damascene structure, as Tang et al. describe in U.S. patent application Ser. No. 09/112,864, filed Jul. 9, 1998. In this structure, a nitride layer separates two levels of oxide. Because nitride acts as a stop layer, one etching step, sometimes in combination by an initial etch, can etch the lower oxide layer into one feature and concurrently etch the upper oxide layer into a connected, larger feature. The patterned nitride layer operates either as a stop layer or as an intermediate mask. The intermediate nitride layer is substantially planar but has a corner surrounding an aperture opening into the lower dielectric layer.

The oxide etching process of the invention thus provides superior etching characteristics with the use of gases which are novel to semiconductor processing but which are commercially available. The other process parameters are achievable in commercially available plasma reactors.

What is claimed is:

1. An oxide etching process for etching an oxide layer over an underlying feature having a non-oxide corner formed in a substrate, comprising the steps of:
   flowing into a plasma reaction chamber an etching gas mixture comprising
   (a) an unsaturated fluorocarbon selected from the group consisting of hexafluorobutadiene, pentafluoropropylene, and trifluoropropyne,
   (b) a hydrofluoromethane selected from the group consisting of monofluoromethane and difluoromethane, and
   (c) a chemically inactive carrier gas; and
   exciting said etching gas mixture into a plasma to etch said oxide layer selectively to said non-oxide corner.

2. The process of claim 1, wherein said non-oxide corner comprises silicon nitride.

3. The process of claim 1, wherein said inactive carrier gas comprises argon.

4. The process of claim 3, wherein said hydrofluoromethane comprises difluoromethane.

5. The process of claim 1, wherein said unsaturated fluorocarbon comprises hexafluorobutadiene.

6. The process of claim 1, wherein said flowing step is a second flowing step, wherein said etching gas mixture is a second etching gas mixture, and wherein said plasma is a second plasma and further comprising the steps performed before said second flowing step and said exciting step of:
   a first step of flowing into said plasma reaction chamber a first gas mixture comprising
   (a) said unsaturated fluorocarbon, and
   (b) said chemically inactive carrier gas and less of said fluoromethane than in said second flowing step; and
   a first step of said exciting said first gas mixture into a first plasma to etch said oxide layer.

7. The process of claim 6, wherein said first plasma produces a more vertical profile in said oxide layer than said second plasma and wherein said second plasma is more selective to said non-oxide corner than said first plasma.

8. The process of claim 1, wherein said flowing step flows less of said hydrofluoromethane and more of said chemically inactive carrier gas than of said unsaturated fluorocarbon.

9. The process of claim 1, further comprising maintaining a pressure in said reaction chamber of no more than 20 milliTorr.

10. The process of claim 1, further comprising the step of maintaining a silicon surface of said reaction chamber at a temperature of at least 245° C.

11. The process of claim 1, wherein said exciting step excites said plasma in a source region apart from said substrate and further comprising RF biasing a pedestal electrode supporting said substrate with an RF biasing power.

12. The process of claim 11, wherein said exciting step includes inductively coupling RF plasma source power into said chamber.

13. The process of claim 12, wherein said RF biasing power is between 50% and 150% of said RF plasma source power.

14. The process of claim 12, said step of inductively coupling RF plasma source power into said chamber couples more power into an outer portion of an area overlying said substrate than into an inner portion of said area.

15. The process of claim 1, wherein said unsaturated fluorocarbon comprises pentafluoropropylene.

16. The process of claim 1, wherein said unsaturated fluorocarbon comprises trifluoropropyne.

17. An oxide etching process for etching an oxide layer over an underlying feature having a non-oxide corner formed in a substrate, comprising the steps of:
   a first step of flowing into a plasma chamber a first etching gas mixture comprising an unsaturated hydrofluorocarbon selected from the group consisting of hexafluorobutadiene, pentafluoropropylene, and trifluoropropyne and a chemically inactive gas;
   a first step of exciting said first etching gas mixture into a first plasma etching said oxide layer with a substantially vertical profile;
   a second step, performed subsequently to said first flowing step, of flowing into said plasma chamber a second etching gas mixture comprising a hydrofluoromethane and a chemically inactive gas; and
   a second step of exciting said second etching gas mixture into a second plasma etching said oxide layer with enhanced selectivity to said non-oxide corner.

18. The oxide etching process of claim 17, wherein said second etching gas mixture additionally comprises said unsaturated fluorocarbon.

19. The oxide etching process of claim 18, wherein in said second flowing step a flow of unsaturated fluorocarbon is greater than a flow of said hydrofluoromethane.

20. The oxide etching process of claim 19, wherein in said second flowing step a flow of said chemically inactive gas is greater than a sum of said flows of said unsaturated fluorocarbon and of said hydrofluoromethane.

21. The oxide etching process of claim 20, wherein in said first flowing step a flow of said chemically inactive gas is greater than a flow of said unsaturated fluorocarbon.

22. The oxide etching process of claim 17, wherein said unsaturated hydrofluorocarbon comprises hexafluorobutadiene.

23. The oxide etching process of claim 17, wherein said hydrofluoromethane comprises difluoromethane.

24. The oxide etching process of claim 17, further comprising maintaining during said first and second exciting steps a silicon surface in said plasma chamber at a temperature of at least 245° C.

25. The process of claim 17, wherein said unsaturated fluorocarbon comprises pentafluoropropylene.

26. The process of claim 17, wherein said unsaturated fluorocarbon comprises trifluoropropyne.

27. A method of etching an oxide layer over a non-oxide layer formed in a substrate, comprising the steps of:
flowing into a plasma reaction chamber a etching gas mixture comprising trifluoropropyne and a chemically inactive carrier gas; and
exciting said etching gas mixture into a plasma to selectively etch said oxide layer selectively to said non-oxide layer.

28. The method of claim 27, further comprising RF biasing a pedestal electrode supporting said substrate and wherein said exciting step excites said plasma in a plasma source region remote from said pedestal electrode.

29. The method of claim 28, wherein said exciting step includes inductively coupling RF plasma source power into plasma source region in said chamber.

30. The method of claim 27, wherein said etching gas mixture additionally comprises a fluoromethane selected from the group consisting of monofluoromethane and difluoromethane.

31. The method of claim 27, in which said flowing step comprises sequentially flowing said etching gas mixture and then flowing a fluorocarbon gas which is more strongly polymerizing than said trifluoropropyne.

32. The method of claim 31, wherein said fluorocarbon gas comprises at least one of monofluoromethane and difluoromethane.

33. The method of claim 32, wherein said fluorocarbon gas comprises difluoromethane.

34. An oxide etching process for etching an oxide layer formed in a substrate over a non-oxide layer, comprising:
a first flowing step of flowing into a plasma reaction chamber a first etching gas mixture comprising a first amount of $C_4F_6$ and a second amount of a chemically inactive carrier gas;
a first exciting step of exciting said first gas mixture into a first plasma to etch said oxide layer;
a second flowing step of flowing into said chamber a second etching gas mixture comprising a third amount of $C_4F_6$, a fourth amount of a hydrofluoromethane selected from the group consisting of monofluoromethane and difluoromethane, and a fifth amount of a chemically inactive carrier gas; and
a second exciting step of exciting said second gas mixture into a second plasma to etch said oxide layer.

35. The process of claim 34, wherein said first plasma produces a more vertical profile in said oxide layer than said second plasma and wherein said second plasma is more selective to said non-oxide layer than said first plasma.

36. The process of claim 34, wherein said fourth amount is greater than said third amount and less than said fifth amount.

37. The process of claim 34, wherein said hydrofluoromethane is difluoromethane.

38. An oxide etching process for etching an oxide layer over an underlying non-oxide layer formed in a substrate, wherein said non-oxide layer comprises silicon nitride, said process comprising the steps of:
flowing into a plasma reaction chamber an etching gas mixture comprising
(a) an unsaturated fluorocarbon selected from the group consisting of hexafluorobutadiene, pentafluoropropylene, and trifluoropropyne,
(b) a hydrofluoromethane selected from the group consisting of monofluoromethane and difluoromethane, and
(c) a chemically inactive carrier gas;
RF biasing a pedestal electrode; and
exciting said etching gas mixture into a plasma in a plasma source region remote from said pedestal electrode to etch said oxide layer with high selectivity to said non-oxide layer.

39. The etching process of claim 38, wherein said plasma is a high-density plasma.

40. The etching process of claim 38, wherein said exciting step inductively couples RF energy into said plasma source region.

41. The etching process of claim 38, wherein said unsaturated fluorocarbon comprises hexafluorobutadiene.

42. An oxide etching process for etching an oxide layer, a non-oxide corner being exposed during said process, comprising the steps of:
flowing into a plasma reaction chamber an etching gas mixture comprising
(a) a first amount of $C_4F_6$,
(b) a second amount of a hydrofluoromethane selected from the group consisting of monofluoromethane and difluoromethane, and
(c) a third amount of a chemically inactive carrier gas; and
exciting said etching gas mixture into a first plasma to etch said oxide layer selectively to said non-oxide corner.

43. The process of claim 42, wherein said hydrofluoromethane comprises difluoromethane.

44. The process of claim 42, wherein said third amount is greater than said first amount.

45. An oxide etching process for etching an oxide layer selectively to a non-oxide layer formed in a substrate, comprising the steps of:
flowing into a plasma reaction chamber containing said substrate an etching gas comprising trifluoropropyne; and
exciting said etching gas into a plasma to etch said oxide layer selective to said non-oxide layer.

46. The process of claim 45, wherein said etching gas additionally comprises a chemically inactive carrier gas.

47. The process of claim 46, wherein said etching gas additionally comprises a hydrofluoromethane selected from the group consisting of monofluoromethane and difluoromethane.

48. An oxide etching process for etching an oxide layer in a substrate having over a non-oxide layer exposed during said process, wherein said non-oxide layer comprises silicon nitride, said process comprising the steps of:

flowing into a plasma reaction chamber an etching gas mixture comprising $C_4F_6$, a hydrofluoromethane, and a chemically inactive carrier gas;

RF biasing a pedestal electrode supporting said substrate; and exciting said etching gas mixture into a plasma in a plasma source region remote from said pedestal electrode to etch said oxide layer with high selectivity to said non-oxide layer.

49. The process of claim 48, wherein said exciting step inductively couples RF energy into said plasma source region.

50. An oxide etching process for etching an oxide layer in a substrate having over an non-oxide layer exposed during said process, comprising the steps of:

flowing into a plasma reaction chamber an etching gas mixture comprising $C_4F_6$, difluoromethane and a chemically inactive carrier gas;

RF biasing a pedestal electrode supporting said substrate; and exciting said etching gas mixture into a plasma in a plasma source region remote from said pedestal electrode to etch said oxide layer with high selectivity to said non-oxide layer.

51. An oxide etching process for etching an oxide layer over an underlying non-oxide layer formed in a substrate comprising the steps of:

flowing into a plasma reaction chamber an etching gas mixture comprising
 (a) an unsaturated fluorocarbon comprising pentafluoropropylene,
 (b) a hydrofluoromethane selected from the group consisting of monofluoromethane and difluoromethane, and
 (c) a chemically inactive carrier gas;

RF biasing a pedestal electrode; and exciting said etching gas mixture into a plasma in a plasma source region remote from said pedestal electrode to etch said oxide layer with high selectivity to said non-oxide layer.

52. An oxide etching process for etching an oxide layer over an underlying non-oxide layer formed in a substrate, comprising the steps of:

flowing into a plasma reaction chamber an etching gas mixture comprising
 (a) trifluoropropyne,
 (b) a hydrofluoromethane selected from the group consisting of monofluoromethane and difluoromethane, and
 (c) a chemically inactive carrier gas;

RF biasing a pedestal electrode; and exciting said etching gas mixture into a plasma in a plasma source region remote from said pedestal electrode to etch said oxide layer with high selectivity to said non-oxide corner.

* * * * *